(12) United States Patent
Iizuka et al.

(10) Patent No.: US 7,799,700 B2
(45) Date of Patent: Sep. 21, 2010

(54) METHOD FOR APPLYING RESIN FILM TO FACE OF SEMICONDUCTOR WAFER

(75) Inventors: Kentaro Iizuka, Tokyo (JP); Takashi Sampei, Tokyo (JP); Nobuyasu Kitahara, Tokyo (JP); Yohei Yamashita, Tokyo (JP)

(73) Assignee: Disco Corporation, Tokyo (JP)

( * ) Notice: Subject to any disclaimer, the term of this patent is extended or adjusted under 35 U.S.C. 154(b) by 80 days.

(21) Appl. No.: 11/514,901

(22) Filed: Sep. 5, 2006

(65) Prior Publication Data
US 2007/0054498 A1 Mar. 8, 2007

(30) Foreign Application Priority Data
Sep. 6, 2005 (JP) ............................. 2005-257683

(51) Int. Cl.
*H01L 21/31* (2006.01)
*H01L 21/00* (2006.01)
(52) U.S. Cl. .................... 438/758; 438/33; 438/906
(58) Field of Classification Search ............... 438/33, 438/758, 906
See application file for complete search history.

(56) References Cited
U.S. PATENT DOCUMENTS
6,114,254 A * 9/2000 Rolfson ................. 438/758
6,218,727 B1 * 4/2001 Merkl et al. ............ 257/677
6,998,571 B2 2/2006 Sekiya et al.
2002/0035762 A1 * 3/2002 Okuda et al. ............ 15/77
2004/0211762 A1 * 10/2004 Sekiya et al. ........ 219/121.82
2005/0136653 A1 * 6/2005 Ramirez et al. .......... 438/646

FOREIGN PATENT DOCUMENTS
JP 2004-322168 11/2004

* cited by examiner

*Primary Examiner*—Alexander G Ghyka
*Assistant Examiner*—Leonard Chang
(74) *Attorney, Agent, or Firm*—Smith, Gambrell & Russell, LLP

(57) ABSTRACT

A method for applying a resin film to the face of a semiconductor wafer, comprising: an assembly holding step of holding an assembly on the surface of chuck means, with the back of the assembly being opposed to the surface of the chuck means, the assembly including a frame having a mounting opening formed in a central portion of the frame, and a semiconductor wafer mounted in the mounting opening of the frame by sticking a mounting tape to the back of the frame and the back of the semiconductor wafer; a liquid droplet supply step of supplying liquid droplets of a solution having a resin dissolved therein onto the face of the semiconductor wafer in the assembly after the assembly holding step; and a spreading step of rotating the chuck means subsequently to the liquid droplet supply step, thereby spreading the liquid droplets throughout the face of the semiconductor wafer. The method further comprises a cleaning step of rotating the chuck means and also supplying a cleaning fluid to the surface of the frame after the spreading step, thereby cleaning the solution which has adhered to the surface of the frame.

4 Claims, 3 Drawing Sheets

METHOD FOR APPLYING RESIN FILM TO FACE OF SEMICONDUCTOR WAFER

FIELD OF THE INVENTION

This invention relates to a method for applying a resin film to the face of a semiconductor wafer. More specifically, the invention relates to a method for applying a resin film to the face of a semiconductor wafer by supplying liquid droplets of a solution of a resin to the face of a semiconductor wafer mounted on a frame via a mounting tape, and then rotating the frame and the semiconductor wafer mounted thereon, thereby spreading the liquid droplets to the entire face of the semiconductor wafer.

DESCRIPTION OF THE PRIOR ART

As is well known among people skilled in the art, it is common practice in the manufacture of a semiconductor device to partition the face of a semiconductor wafer into many rectangular regions by streets arranged in a lattice pattern, form a semiconductor circuit in each of the rectangular regions, and then divide the semiconductor water along the streets, thereby obtaining the individually separated rectangular regions, namely, semiconductor devices. As a mode of dividing the semiconductor wafer along the streets, a mode called laser dicing is put to practical use. In this laser dicing method, the face of the semiconductor wafer is irradiated with a laser beam along the street to melt the face of the semiconductor wafer along the street, thereby forming a groove along the street, followed by breaking the semiconductor wafer along the groove.

In the above-described laser dicing, when the face of the semiconductor wafer is melted along the street by irradiation with the laser beam, debris generated by melting scatters over the rectangular region, and may damage the semiconductor circuit formed in the rectangular region. Prior to laser dicing, therefore, it is necessary to apply a resin film to the face of the semiconductor wafer in order to protect the semiconductor circuit from the scattered debris.

Japanese Unexamined Patent Publication No. 2004-322168 discloses that a resin coating and cleaning apparatus is built into a dicer for performing laser dicing, the resin coating and cleaning apparatus being capable of applying a resin coating to the face of a semiconductor wafer before laser dicing, and also cleaning the face of the semiconductor wafer after laser dicing. The resin coating and cleaning apparatus comprises a rotationally driven chuck means, a liquid droplet supply means, a cleaning fluid supply means, and a drying gas supply means. The semiconductor wafer to be given the resin coating on the face thereof is handled in a state in which the semiconductor wafer is mounted on a frame via a mounting tape. In other words, the semiconductor wafer is handled as an assembly of the frame having a mounting opening in its central portion, and the semiconductor wafer mounted in the mounting opening of the frame by sticking the mounting tape to the back of the frame and the back of the semiconductor wafer. In applying the resin coating to the face of the semiconductor wafer, the assembly is mounted on the chuck means, with the back of the assembly (accordingly, the back of each of the semiconductor wafer, the frame, and the mounting tape) being opposed to the surface of the chuck means. Then, liquid droplets of a solution having resin dissolved therein are supplied to a central portion of the face of the semiconductor wafer. Then, the chuck means is rotated at a high speed, whereby the liquid droplets are spread throughout the face of the semiconductor wafer.

According to the experience of the inventors of the present application, the above-described method for applying the resin coating, disclosed in Japanese Unexamined Patent Publication No. 2004-322168, has been found to involve the following problem to the solved: When the chuck means is rotated at a high speed in order to spread the liquid droplets supplied to the central portion of the face of the semiconductor wafer, the solution scatters, although slightly, over the surface of the frame and adheres there. In transporting the assembly within the laser dicer, or carrying the assembly out of the laser dicer, a transport means equipped with a vacuum attraction type pad is usually used. The pad is pressed against the surface of the frame to attract the assembly under vacuum and, in this state, the assembly is transported to a required location. There, the vacuum of the pad is released to detach the assembly from the pad. If the solution adheres to the surface of the frame, however, there is a tendency toward the occurrence of a situation in which the frame, accordingly, the assembly, is not detached from the pad even upon release of the vacuum of the pad, owing to the tackiness of the solution.

SUMMARY OF THE INVENTION

It is an object of the present invention, therefore, to improve a method for applying a resin film to the face of a semiconductor wafer such that detachment of the assembly from the pad is not impeded.

According to the present invention, in order to attain the above object, after liquid droplets supplied to a central portion of the face of a semiconductor water are spread by rotation of a chuck means, a cleaning fluid is supplied to the surface of a frame, with the chuck means being rotated, whereby a solution which has scattered over the surface of the frame is cleaned.

That is, according to the present invention, there is provided, for attainment of the above object, a method for applying a resin film to the face of a semiconductor wafer, comprising:

an assembly holding step of holding an assembly on the surface of a chuck means, with the back of the assembly being opposed to the surface of the chuck means, the assembly including a frame having a mounting opening formed in a central portion of the frame, and a semiconductor wafer mounted in the mounting opening of the frame by sticking a mounting tape to the back of the frame and the back of the semiconductor wafer;

a liquid droplet supply step of supplying liquid droplets of a solution having a resin dissolved therein onto the face of the semiconductor wafer in the assembly after the assembly holding step; and a spreading step of rotating the chuck means subsequently to the liquid droplet supply step, thereby spreading the liquid droplets throughout the face of the semiconductor wafer, the method further comprising a cleaning step of rotating the chuck means and also supplying a cleaning fluid to the surface of the frame after the spreading step, thereby cleaning the solution which has adhered to the surface of the frame.

The cleaning fluid may be pure water. Preferably, in the cleaning step, the chuck means is rotated at 1 to 100 rpm, and the cleaning fluid is supplied for 5 to 30 seconds at a pressure of 0.1 to 0.3 MPa at a rate of 10 to 100 ml/min.

DETAILED DESCRIPTION OF THE PREFERRED EMBODIMENTS

Preferred embodiments of the method for applying a resin film to the face of a semiconductor wafer according to the present invention will be described in further detail by reference to the accompanying drawings.

Figure 1:
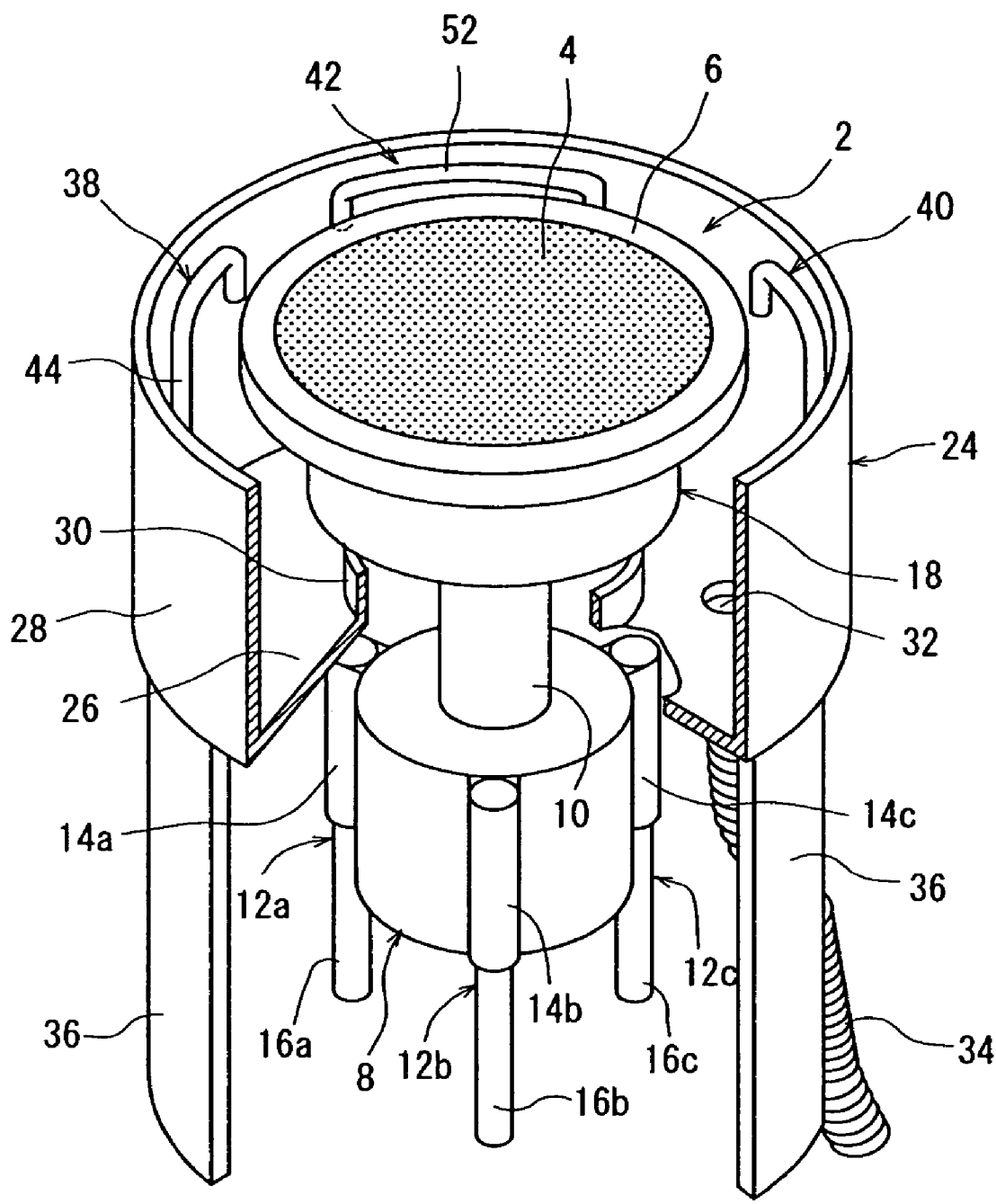
FIG. 1 is a partially cutaway perspective view showing a typical example of an apparatus for use in carrying out a preferred embodiment of the method according to the present invention.
Figure 2:
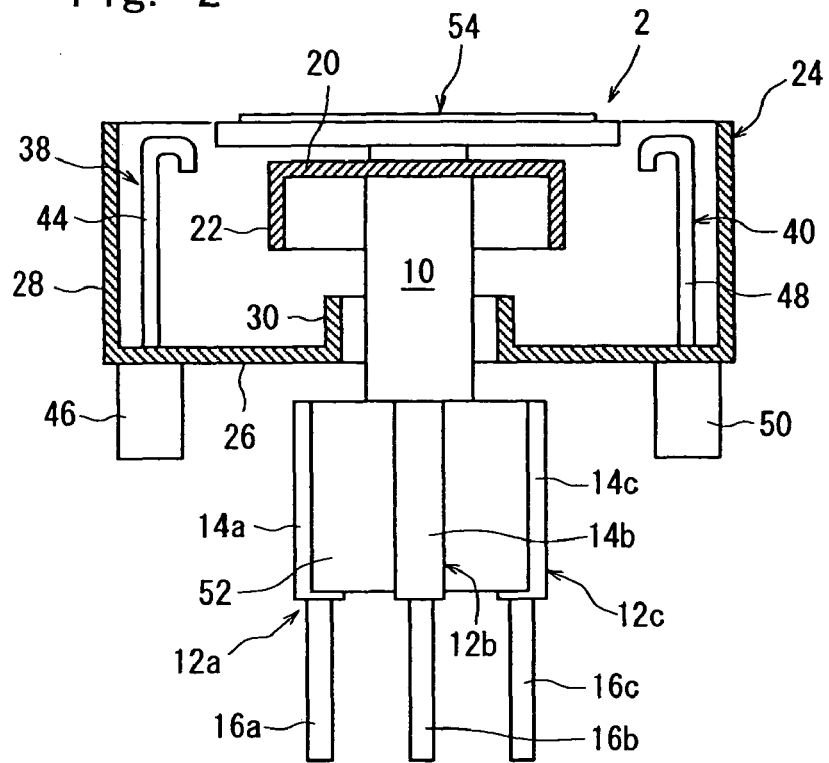
FIG. 2 is a partial sectional view showing a main part of the apparatus of FIG. 1.

Referring to FIGS. 1 and 2 showing a typical example of an apparatus for performing the method of the present invention, the illustrated apparatus is equipped with a chuck means 2. The chuck means 2 is composed of a disk-shaped chuck plate 4 formed from a porous material such as a porous ceramic, and an annular frame body 6 encircling the chuck plate 4. The annular frame body 6 can be formed from stainless steel. An electric motor 8 is disposed below the chuck means 2. An output shaft 10 of the electric motor 8 extends out upwardly and substantially vertically. The chuck means 2 is fixed to the upper end of the output shaft 10, and is placed substantially horizontally. The electric motor 8 is mounted on a support base board (not shown) via three hydraulic cylinder mechanisms 12a, 12b and 12c extending in the vertical direction. In more detail, cylinders 14a, 14b and 14c of the three hydraulic cylinder mechanisms 12a, 12b and 12c are equally spaced in the circumferential direction and fixed to the outer periphery of the casing of the electric motor 8, while the leading ends, namely, the lower ends, of pistons 16a, 16b and 16c of the three hydraulic cylinder mechanisms 12a, 12b and 12c are fixed on the substantially horizontal surface of the support base board. Thus, when the pistons 16a, 16b and 16c of the cylinder mechanisms 12a, 12b and 12c are expanded, the electric motor 8 and the chuck means 2 are raised. When the pistons 16a, 16b and 16c of the cylinder mechanisms 12a, 12b and 12c are contracted, the electric motor 8 and the chuck means 2 are lowered. Directly below the chuck means 2, a cover member 18 is fixed to the output shaft 10 of the electric motor 8. The cover member 18 has an annular top wall 20 whose central portion the output shaft 10 is inserted through, and a cylindrical wall 22 drooping from the peripheral edge of the top wall 20.

The illustrated apparatus is also furnished with a stationary container 24 surrounding the chuck means 2. The container 24 has an annular bottom wall 26, an outer cylindrical wall 28 extending upward from the outer peripheral edge of the bottom wall 26, and an inner cylindrical wall 30 extending upward from the inner peripheral edge of the bottom wall 26. The outer diameter of the inner cylindrical wall 30 is somewhat smaller than the outer diameter of the cylindrical wall 22 of the cover member 18. An outlet 32 is formed in the bottom wall 26, and a discharge conduit 34 is connected to the outlet 32 (reference to FIG. 1 is requested). The container 24 is fixed onto the surface of the support base board via three support legs 36 (only two of the support legs 36 are shown in FIG. 1) disposed with equal spacing in the circumferential direction.

In the illustrated apparatus, a liquid droplet supply means 38, a cleaning fluid supply means 40, and a drying gas supply means 42 are further disposed. The liquid droplet supply means 38 is provided with a nozzle 44, and the nozzle 44 has an upright portion extending along the inner peripheral surface of the outer cylindrical wall 28 of the container 24, a horizontal portion extending substantially horizontally from the upper end of the upright portion, and a drooping portion extending downward from the leading end of the horizontal portion. The upright portion is inserted through the bottom wall 26 of the container 24, projected downward, and coupled to an output shaft of an electric motor 46 (FIG. 2) fixed to the lower surface of the bottom wall 26. Thus, when the electric motor 46 is energized, the nozzle 44 is turned about a central axis of the upright portion thereof. The nozzle 44 is connected to a solution supply source (not shown) via a suitable communication means (not shown for avoiding complexity of the drawings). The solution supply source supplies the nozzle 44 with a solution which is preferably an aqueous solution having dissolved therein a water-soluble resin such as polyvinyl alcohol, polyethylene glycol, or polyethylene oxide.

The cleaning fluid supply means 40 is provided with a nozzle 48, and the nozzle 48 has an upright portion extending along the inner peripheral surface of the outer cylindrical wall 28 of the container 24, a horizontal portion extending substantially horizontally from the upper end of the upright portion, and a drooping portion extending downward from the leading end of the horizontal portion. The upright portion is inserted through the bottom wall 26 of the container 24, projected downward, and coupled to an output shaft of an electric motor 50 (FIG. 2) fixed to the lower surface of the bottom wall 26. Thus, when the electric motor 50 is energized, the nozzle 48 is turned about a central axis of the upright portion thereof. The nozzle 48 is connected to a cleaning fluid supply source (not shown) via a suitable communication means (not shown for avoiding complexity of the drawings). The cleaning fluid supply source supplies the nozzle 48 with a cleaning fluid which may be pure water. If desired, a gas, which may be air, can be supplied to the nozzle 48, together with the cleaning fluid which may be pure water.

The drying gas supply means 42 is provided with a nozzle 52, and the nozzle 52 has an upright portion extending along the inner peripheral surface of the outer cylindrical wall 28 of the container 24, a horizontal portion extending substantially horizontally from the upper end of the upright portion, and a drooping portion hanging downward from the leading end of the horizontal portion. The upright portion is inserted through the bottom wall 26 of the container 24, projected downward, and coupled to an output shaft of an electric motor (not shown) fixed to the lower surface of the bottom wall 26. Thus, when the electric motor is energized, the nozzle 52 is turned about a central axis of the upright portion thereof. The nozzle 52 is connected to a drying gas supply source (not shown) via a suitable communication means (not shown for avoiding complexity of the drawings). The drying gas supply source supplies the nozzle 52 with a drying gas which may be room temperature air or heated air.

The above-described apparatus may be substantially the same as the apparatus disclosed in the aforementioned Japanese Unexamined Patent Publication No. 2004-322168. Thus, a detailed description of the above-mentioned apparatus per se is omitted herein.

Figure 3:
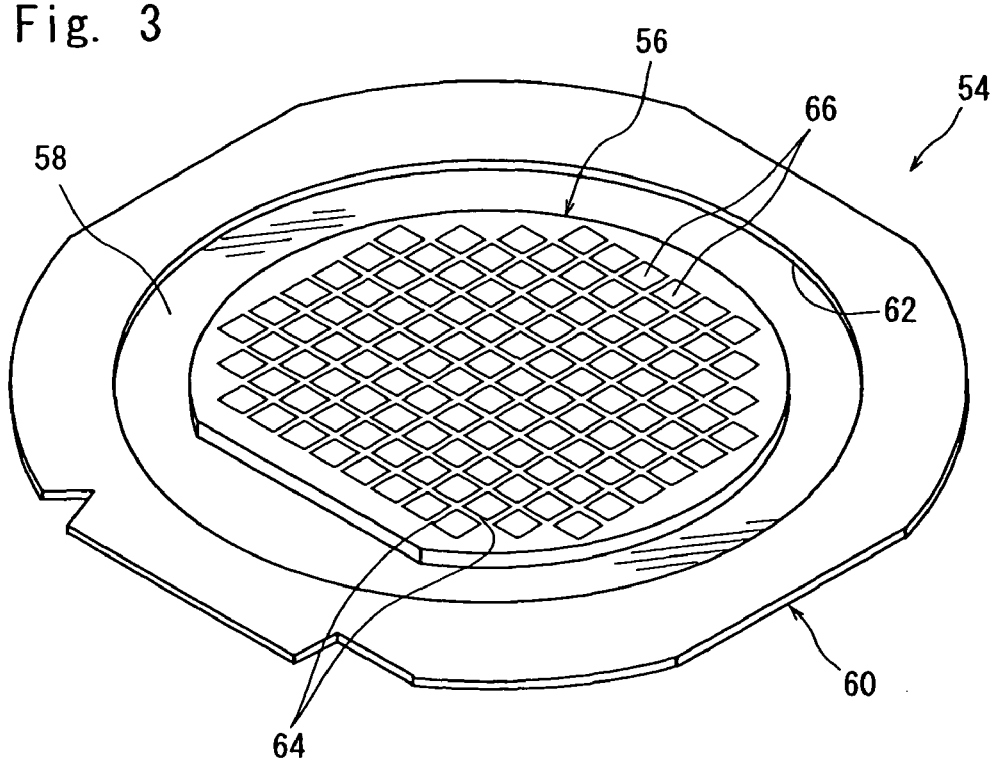
FIG. 3 is a perspective view showing an assembly having a semiconductor wafer mounted on a frame via a mounting tape.

FIG. 3 shows an assembly 54 in which a semiconductor wafer 56 to be given a resin film on its face is mounted on a frame 60 via a mounting tape 58. The frame 60, which can be formed from a suitable metal such as aluminum or stainless steel or from a suitable synthetic resin, has a mounting opening 62 of a relatively large circular shape in a central portion thereof. The semiconductor wafer 56, nearly disk-shaped, is positioned within the mounting opening 62 of the frame 60. The mounting tape 58 extending across the mounting opening 62 is stuck to the back of the frame 60 and the back of the semiconductor wafer 56, whereby the semiconductor wafer 56 is mounted in the mounting opening 62 of the frame 60. Many rectangular regions 66 are defined on the face of the semiconductor wafer 56 by streets 64 arranged in a lattice pattern, and a semiconductor circuit is formed in each of the rectangular regions 66.

The following is a detailed description of a preferred embodiment of the method for applying a resin film to the face of the semiconductor wafer 56 in the assembly 54 according to the present invention, the method being carried out with the use of the above-described apparatus.

First of all, an assembly holding step is performed. In this assembly holding step, the pistons 16a, 16b and 16c of the cylinder mechanisms 12a, 12b and 12c are expanded to bring the chuck means 2 to an ascent position shown in FIG. 2. The upper surface of the chuck means 2 located at the ascent position is advantageously at substantially the same height as the upper end of the outer cylindrical wall 28 of the container 24. The assembly 54 is carried in onto the chuck means 2 by a suitable transport means (not shown), with the back of the assembly 54 being opposed to the surface of the chuck means 2, accordingly, with the face of the semiconductor wafer 56 pointing upward. The transport means may be of the type having a plurality of vacuum attraction pads which are pressed against the frame 60 in the assembly 54. When the assembly 54 disengaged from the transport means is placed on the chuck means 2, the chuck plate 4 of the chuck means 2 is connected to a vacuum source (not shown) via a suitable communication passage (not shown), whereby the assembly 54 is attracted onto the chuck means 2 by suction.

Figure 4:
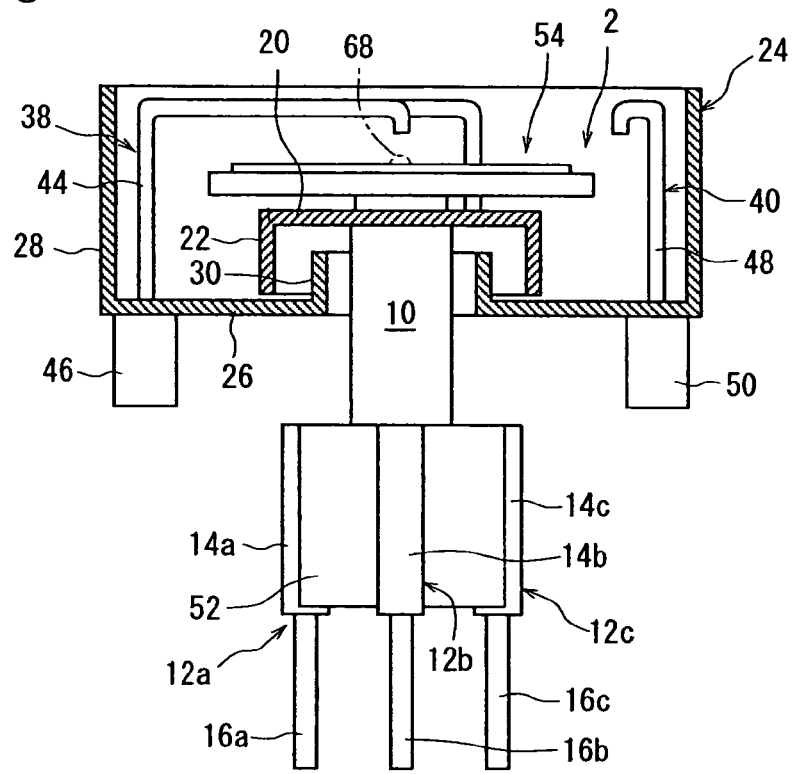
FIG. 4 is a sectional view similar to FIG. 2, showing a mode of performing a liquid droplet supply step with the use of the apparatus of FIG. 1.

Then, a liquid droplet supply step is performed. In this liquid droplet supply step, the pistons 16a, 16b and 16c of the cylinder mechanisms 12a, 12b and 12c are contracted to bring the chuck means 2 and the assembly 54 held on the surface thereof to a descent position shown in FIG. 4. Then, the nozzle 44 of the liquid droplet supply means 38 is moved to a position shown in FIG. 4, namely, a position where the tip of the nozzle 44 opposes the center of the semiconductor wafer 56 in the assembly 54. Then, a required amount of liquid droplets is dropped through the nozzle 44, and supplied onto the semiconductor wafer 56. In FIG. 4, a liquid droplet 68 supplied onto the semiconductor wafer 56 is indicated by dashed double-dotted lines. The liquid droplet 68 is advantageously a relatively high viscosity solution having a water-soluble resin, such as polyvinyl alcohol, polyethylene glycol, or polyethylene oxide, dissolved in pure water.

Then, a spreading step is performed. In the spreading step, the electric motor 8 is energized to rotate the chuck means 2 and the assembly 54 held thereby, for example, at a speed of the order of 500 to 3,000 rpm for a time of the order of 30 to 120 seconds. By this rotation, the liquid droplets 68 are spread over the entire face of the semiconductor wafer 56 to apply a resin film to the face of the semiconductor wafer 56. According to the experience of the inventors, in the spreading step, the solution constituting the liquid droplets 68 tends to scatter, although slightly, over the surface of the frame 60 in the assembly 54.

Figure 5:
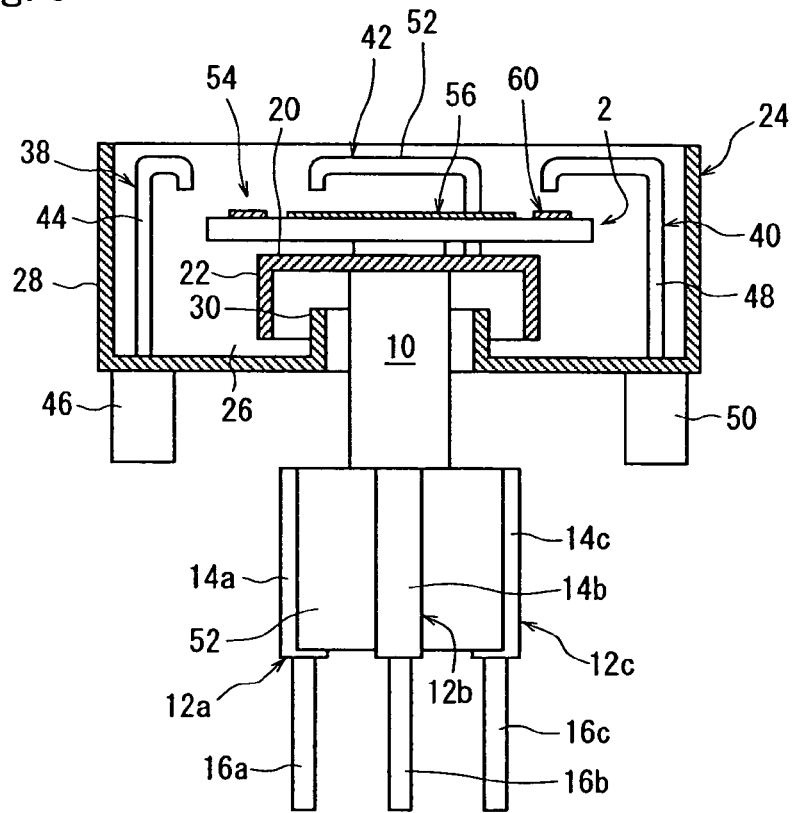
FIG. 5 is a sectional view similar to FIG. 2, showing a mode of performing a cleaning step with the use of the apparatus of FIG. 1.

With the method of the present invention, it is important that the above spreading step be followed by a cleaning step. In this cleaning step, as shown in FIG. 5, the nozzle 44 of the liquid droplet supply means 38 is returned to a non-operating position (the position shown in FIG. 2) where the nozzle 44 is located close to the outer cylindrical wall 28 of the container 24. On the other hand, the nozzle 48 of the cleaning fluid supply means 40 is moved to a position shown in FIG. 5, namely, a position where the tip of the nozzle 48 opposes the surface of the frame 60 in the assembly 54. Then, the cleaning fluid is gushed through the nozzle 48, and the electric motor 8 is energized to rotate the chuck means 2 and the assembly 54 held thereby. By so doing, the cleaning fluid acts on the surface of the frame 60 to clean the solution scattering over the surface of the frame. The cleaning fluid may be pure water, and is preferably supplied for 5 to 30 seconds at a pressure of 0.1 to 0.3 MPa at a rate of the order of 10 to 100 ml/min. If desired, pressurized air can be jetted, together with the cleaning fluid, through the nozzle 48. The rotational speed of the chuck means 2 and the assembly 54 held thereby may be of the order of 1 to 100 rpm. After acting on the surface of the frame 60, the gushed cleaning fluid flows down into the container 24, and is discharged through the outlet 32 and the discharge conduit 34.

After completion of the cleaning step, the electric motor 8 is deenergized to return the nozzle 48 of the cleaning fluid supply means 40 to a non-operating position (the position shown in FIG. 2) where the nozzle 48 is located close to the outer cylindrical wall 28 of the container 24. Then, the pistons 16a, 16b and 16c of the cylinder mechanisms 12a, 12b and 12c are expanded to bring the chuck means 2 to the ascent position shown in FIG. 2. Then, the chuck plate 4 of the chuck means 2 is cut off from the vacuum source, and the assembly 54 is carried out from above the chuck means 2 by the suitable transport means (not shown), and carried into a laser dicing zone, for example.

In cleaning the face of the diced semiconductor wafer 56 after completion of laser dicing, the assembly 54 is carried in onto the chuck means 2, which is located at the ascent position shown in FIG. 2, by the suitable transport means (not shown), with the back of the assembly 54 opposing the chuck means 2 (even after dicing, the individually separated rectangular regions 66 of the semiconductor wafer 56 are stuck to the mounting tape 58, and the assembly 54 is kept integrated). When the assembly 54 released from the transport means is placed on the chuck means 2, the chuck plate 4 of the chuck means 2 is connected to the vacuum source (not shown) via the suitable communication passage (not shown). Thus, the assembly 54 is attracted onto the chuck means 2 by suction. Then, the pistons 16a, 16b and 16c of the cylinder mechanisms 12a, 12b and 12c are contracted to bring the chuck means 2 and the assembly 54 held on its surface to the descent position shown in FIG. 4. Then, the electric motor 8 is energized to rotate the chuck means 2 and the assembly 54 held thereby. Also, the cleaning fluid, or pressurized air together with the cleaning fluid, is gushed through the nozzle 48 of the cleaning fluid supply means 40. On this occasion, the nozzle 48 is pivoted in a reciprocating manner within a required range corresponding to the face of the semiconductor wafer 56 to be cleaned. When the cleaning fluid, or pressurized air together with the cleaning fluid, is gushed toward the face of the semiconductor wafer 56, the water-soluble resin present on the face of the semiconductor wafer 56 is dissolved, removed, and flowed down into the container 24 together with the cleaning fluid.

After completion of cleaning, the nozzle 48 of the cleaning fluid supply means 40 is returned to the non-operating position. Then, the nozzle 52 of the drying gas supply means 42 is pivoted in a reciprocating manner within a required range corresponding to the face of the semiconductor wafer 56, and a drying gas is gushed through the nozzle 52, whereby the semiconductor wafer 56 is dried. The drying gas may be room temperature air or heated air.

After completion of drying, the electric motor 8 is deenergized, and the nozzle 52 of the drying gas supply means 42 is returned to a non-operating position (position shown in FIG. 2) where the nozzle 52 is located close to the outer cylindrical wall 28 of the container 24. Then, the pistons 16a, 16b and 16c of the cylinder mechanisms 12a, 12b and 12c are expanded to bring the chuck means 2 to the ascent position shown in FIG. 2. Then, the chuck plate 4 of the chuck means 2 is cut off from the vacuum source, and the assembly 54 is carried out from above the chuck means 2 by the suitable transport means (not shown).

While the preferred embodiments of the method according to the present invention have been described in detail by reference to the accompanying drawings, it is to be understood that the invention is not limited to such embodiments, but various changes and modifications may be made without departing from the scope of the invention.

What we claim is:

1. A method for applying a resin film to a face of a semiconductor wafer, comprising:

an assembly holding step of holding an assembly on a surface of chuck means, with a back of the assembly being opposed to the surface of the chuck means, the assembly including a frame having a mounting opening formed in a central portion of the frame, and a semiconductor wafer mounted in the mounting opening of the frame by sticking a mounting tape to a back of the frame and a back of the semiconductor wafer;

a liquid droplet supply step of supplying liquid droplets of a solution having a resin dissolved therein onto a face of the semiconductor wafer in the assembly after the assembly holding step; and a spreading step of rotating the chuck means subsequently to the liquid droplet supply step, thereby spreading the liquid droplets throughout the face of the semiconductor wafer, the method further comprising a cleaning step of rotating the chuck means and also supplying a cleaning fluid directly to a surface of the frame after the spreading step, thereby cleaning the solution which has adhered to the surface of the frame.

2. The method according to claim 1, wherein the cleaning fluid is pure water.

3. The method according to claim 1, wherein in the cleaning step, the chuck means is rotated at 1 to 100 rpm.

4. The method according to claim 3, wherein in the cleaning step, the cleaning fluid is supplied for 5 to 30 seconds at a pressure of 0.1 to 0.3 MPa at a rate of 10 to 100 ml/min.

* * * * *